(12) United States Patent
Galesic et al.

(10) Patent No.: US 8,283,756 B2
(45) Date of Patent: Oct. 9, 2012

(54) ELECTRONIC COMPONENT WITH BUFFER LAYER

(75) Inventors: Ivan Galesic, Regensburg (DE); Joachim Mahler, Regensburg (DE); Alexander Heinrich, Regensburg (DE); Khalil Hosseini, Weihmichl (DE)

(73) Assignee: Infineon Technologies AG, Neubiberg (DE)

( * ) Notice: Subject to any disclaimer, the term of this patent is extended or adjusted under 35 U.S.C. 154(b) by 742 days.

(21) Appl. No.: 11/841,294

(22) Filed: Aug. 20, 2007

(65) Prior Publication Data

US 2009/0051016 A1  Feb. 26, 2009

(51) Int. Cl.
 *H01L 23/495* (2006.01)
(52) U.S. Cl. ........ 257/669; 257/666; 257/676; 257/747; 257/748; 257/E23.037; 257/E23.04; 257/E23.052
(58) Field of Classification Search .................. 257/676, 257/711, 618, 620, 669, 666, 747, 748, E23.037, 257/E23.04, E23.052, E23.054
See application file for complete search history.

(56) References Cited

U.S. PATENT DOCUMENTS

| | | | | |
|---|---|---|---|---|
| 4,929,516 A * | 5/1990 | Pryor et al. | .................. | 428/620 |
| 5,242,099 A | 9/1993 | Ueda | | |
| 5,726,861 A * | 3/1998 | Ostrem | ......................... | 361/767 |
| 5,729,561 A | 3/1998 | Hironaka | | |
| 5,821,627 A * | 10/1998 | Mori et al. | ..................... | 257/780 |
| 5,825,091 A * | 10/1998 | Adams | .......................... | 257/777 |
| 6,046,910 A * | 4/2000 | Ghaem et al. | ................. | 361/760 |
| 6,122,170 A * | 9/2000 | Hirose et al. | .................. | 361/704 |
| 6,281,572 B1 * | 8/2001 | Robbins | ........................ | 257/700 |
| 6,291,776 B1 * | 9/2001 | Markovich et al. | ........... | 174/262 |
| 6,373,125 B1 * | 4/2002 | Pannaccione et al. | ........ | 257/666 |
| 6,380,062 B1 * | 4/2002 | Liu | ............................... | 438/613 |
| 6,531,784 B1 * | 3/2003 | Shim et al. | ..................... | 257/777 |
| 6,570,259 B2 * | 5/2003 | Alcoe et al. | ..................... | 257/778 |
| 6,667,557 B2 * | 12/2003 | Alcoe et al. | ..................... | 257/778 |
| 6,683,369 B2 * | 1/2004 | Iwamoto | ....................... | 257/676 |
| 6,727,587 B2 * | 4/2004 | Riedl | ............................ | 257/748 |
| 6,812,569 B2 * | 11/2004 | Iwatsu et al. | ................... | 257/737 |
| 6,864,579 B2 * | 3/2005 | Gross et al. | ..................... | 257/751 |
| 6,953,708 B2 * | 10/2005 | Hedler et al. | .................. | 438/110 |
| 7,115,446 B2 * | 10/2006 | Koo et al. | ...................... | 438/125 |
| 7,211,472 B2 | 5/2007 | Hedler et | | |
| 7,368,320 B2 * | 5/2008 | Bowen | ......................... | 438/111 |
| 7,372,129 B2 * | 5/2008 | Bowen | ......................... | 257/666 |
| 7,595,228 B2 * | 9/2009 | Abe et al. | ...................... | 438/123 |
| 7,608,533 B2 * | 10/2009 | Costello et al. | ............... | 438/612 |
| 7,714,417 B2 * | 5/2010 | Nonoyama | .................... | 257/669 |
| 7,880,313 B2 * | 2/2011 | Lee et al. | ....................... | 257/778 |
| 7,891,981 B1 * | 2/2011 | Patelzick | ......................... | 439/66 |
| 7,944,028 B2 * | 5/2011 | Saunders et al. | .............. | 257/666 |
| 8,021,929 B2 * | 9/2011 | Nelle et al. | ..................... | 438/123 |

(Continued)

FOREIGN PATENT DOCUMENTS

DE  4235908 A1  4/1994

(Continued)

*Primary Examiner* — Matthew W Such
*Assistant Examiner* — William Harriston
(74) *Attorney, Agent, or Firm* — Dicke, Billig & Czaja, PLLC

(57) ABSTRACT

An electronic component includes a metal substrate, a semiconductor chip configured to be attached to the metal substrate, and a buffer layer positioned between the metal substrate and the semiconductor chip configured to mechanically decouple the semiconductor chip and the metal substrate. The buffer layer extends across less than an entire bottom surface of the semiconductor chip.

18 Claims, 4 Drawing Sheets

U.S. PATENT DOCUMENTS

| | | | |
|---|---|---|---|
| 2003/0201532 A1* | 10/2003 | Riedl | 257/734 |
| 2004/0070057 A1* | 4/2004 | Yoshiike et al. | 257/676 |
| 2004/0130009 A1 | 7/2004 | Tangpuz et al. | |
| 2004/0224440 A1 | 11/2004 | Kinei | |
| 2004/0232546 A1* | 11/2004 | Kang | 257/730 |
| 2005/0048758 A1 | 3/2005 | Hosseini et al. | |
| 2005/0062167 A1* | 3/2005 | Huang et al. | 257/778 |
| 2005/0110163 A1* | 5/2005 | Koo et al. | 257/778 |
| 2005/0161791 A1* | 7/2005 | Hortaleza | 257/685 |
| 2005/0250245 A1 | 11/2005 | Riedl et al. | |
| 2005/0282313 A1* | 12/2005 | Akram et al. | 438/108 |
| 2006/0017174 A1 | 1/2006 | Otremba | |
| 2006/0086118 A1* | 4/2006 | Venkatasubramanian et al. | 62/259.2 |
| 2006/0097366 A1* | 5/2006 | Sirinorakul et al. | 257/666 |
| 2006/0176417 A1* | 8/2006 | Wu et al. | 349/58 |
| 2006/0192295 A1* | 8/2006 | Lee et al. | 257/778 |
| 2007/0025684 A1 | 2/2007 | Otremba | |
| 2007/0034997 A1 | 2/2007 | Bauer et al. | |
| 2007/0040264 A1* | 2/2007 | Hall et al. | 257/701 |
| 2007/0181908 A1 | 8/2007 | Otremba | |
| 2008/0063232 A1* | 3/2008 | Song | 381/355 |
| 2008/0073763 A1* | 3/2008 | Jungsuwadee | 257/676 |
| 2008/0157360 A1* | 7/2008 | Lua et al. | 257/737 |
| 2008/0206925 A1* | 8/2008 | Chatterjee et al. | 438/106 |
| 2009/0001572 A1* | 1/2009 | Kuraya et al. | 257/737 |
| 2009/0002625 A1* | 1/2009 | Koo et al. | 349/158 |
| 2009/0051016 A1* | 2/2009 | Galesic et al. | 257/669 |
| 2009/0083963 A1* | 4/2009 | Otremba | 29/592.1 |

FOREIGN PATENT DOCUMENTS

| | | |
|---|---|---|
| DE | 102004058878 A1 | 6/2006 |
| WO | 2006/060981 | 6/2006 |
| WO | 2006060981 A1 | 6/2006 |

* cited by examiner

ELECTRONIC COMPONENT WITH BUFFER LAYER

BACKGROUND

Semiconductor packages including a semiconductor chip mounted on a substrate suffer from the problem of crack formation at the interfaces between the different materials of the package. Conventional methods for attaching semiconductor chips to a substrate, such as a die pad, include gluing, soldering and alloying. A newer attachment technique is diffusion soldering. Compared to the other methods, diffusion soldering provides a higher mechanical robustness and better thermal performance. Based on the higher mechanical stability of the die attachment, diffusion soldered units show improved behaviour regarding solder crack and fatigue. However, thermal contraction can cause cracks in the silicon in devices processed with diffusion soldering. During thermal cycling of the component, stress occurs at the interfaces due to the difference in the thermal expansion coefficients between the different materials, for example between the die pad of a metal leadframe and a semiconductor chip. This stress can lead to the formation of cracks and even to complete delamination of the chip from the die pad.

Thermal mismatch is a problem for semiconductor chips that are mounted on a metal substrate by diffusion soldering. In these packages, the semiconductor chips are electrically connected to the metal substrate by the bond between the rear surface of the chip and the substrate. A diffusion solder bond has the advantage that a thin bond structure, for example around 10 μm, is provided. This improves thermal dissipation as well as enabling the size of the package to be reduced. However, as the bond structure is thin, it is less able to absorb the stress which occurs due to the mismatch in thermal expansion coefficients. Thermal mismatch is also a problem for other metallic chip interconnect techniques.

It is known to position a buffer layer directly on the rear side of the semiconductor chip or the front side of a die pad. The buffer layer is typically a ductile metal layer that absorbs stress and thereby mechanically decouples the semiconductor chip and the die pad. Existing applications use full-area metal plating (e.g. Ag, Ni/NiP, Au) for the buffer layer. In these applications, the buffer layer extends across the entire bottom surface of the semiconductor chip. By using die pad plating, the occurrence of silicon cracks is reduced, as the plating metal is more ductile than the copper base material of the die pad. However, a disadvantage of plating metals, such as Ag, Ni/NiP, and Au is their poor wettability and solderability compared to copper surfaces. The interdiffusion and intermetallic phase formation with the tin containing solder alloys (typically used in diffusion soldering) is lower for these plating metals than for copper.

For applications in which it is desirable to have a full-area void-free die attachment with appropriate thermal and electrical conductivity, bare copper die pads without plating are used. Since there is no buffering plating used in these applications, chip thickness and chip size are limited in order to prevent horizontal cracks in the silicon.

SUMMARY

One embodiment provides an electronic component including a metal substrate, a semiconductor chip configured to be attached to the metal substrate, and a buffer layer positioned between the metal substrate and the semiconductor chip configured to mechanically decouple the semiconductor chip and the metal substrate. The buffer layer extends across less than an entire bottom surface of the semiconductor chip.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
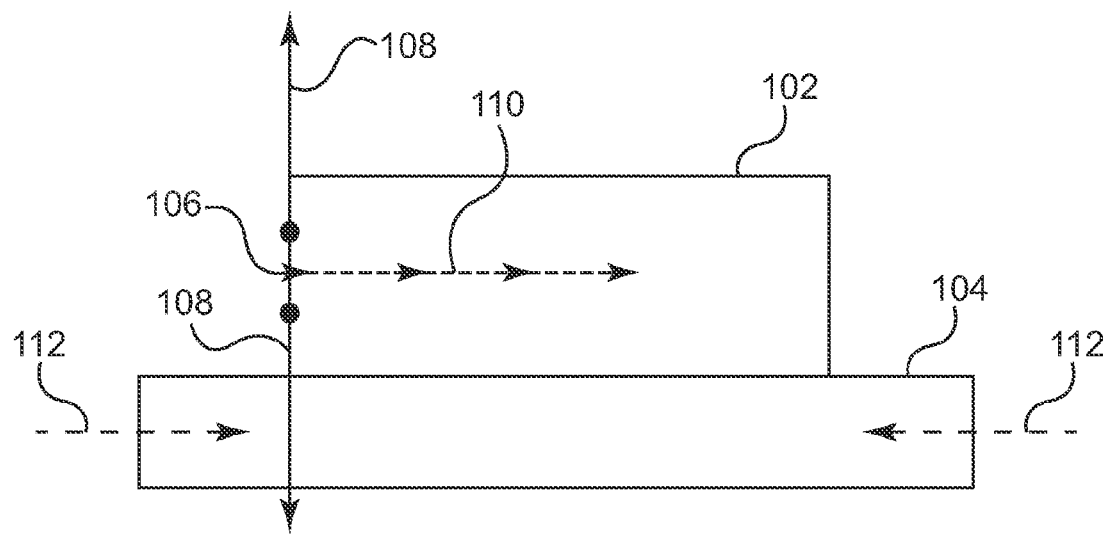
FIG. 1 is a diagram illustrating a side view of a semiconductor chip attached to a substrate with a horizontal crack propagating through the chip due to thermal contraction of the substrate.

FIG. 1 is a diagram illustrating a side view of a semiconductor chip 102 attached to a substrate 104 with a horizontal crack propagating through the chip 102 due to thermal contraction of the substrate 104. With no buffer layer between the chip 102 and the substrate 104, thermal contraction (indicated by arrows 112) of substrate 104 causes tensile stress (indicated by arrows 108) in chip 102. The tensile stress causes a crack 106 at the edge of the chip 102 to propagate through the chip 102, as indicated by arrow 110. Thus, as illustrated in FIG. 1, when there are defects in the side wall of a semiconductor chip, such as crack 106 in chip 102, thermomechanical stress becomes even more critical, and without a buffer layer, can lead to horizontal cracking starting at the chip side walls.

Figure 2:
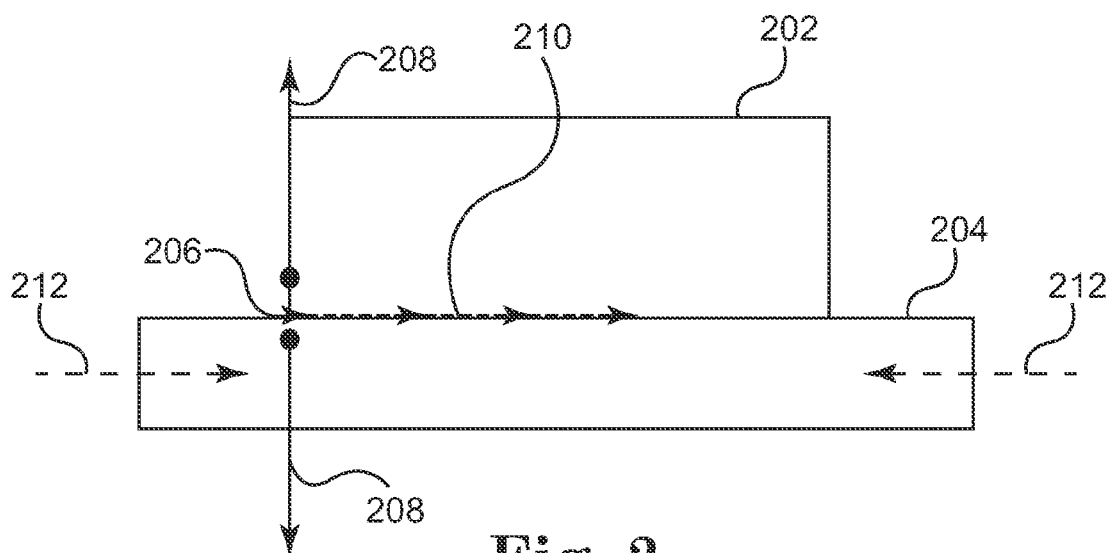
FIG. 2 is a diagram illustrating a side view of a semiconductor chip attached to a substrate and delamination of the chip from the substrate due to thermal contraction of the substrate.

FIG. 2 is a diagram illustrating a side view of a semiconductor chip 202 attached to a substrate 204 and delamination of the chip 202 from the substrate 204 due to thermal contraction of the substrate 204. With no buffer layer between the chip 202 and the substrate 204, thermal contraction (indicated by arrows 212) of substrate 204 causes tensile stress (indicated by arrows 208) in chip 202. The tensile stress causes the edge 206 of the chip 202 to begin to delaminate from the substrate 204, and the delamination propagates through the interface between the chip 202 and the substrate 204, as indicated by arrow 210.

Figure 3:
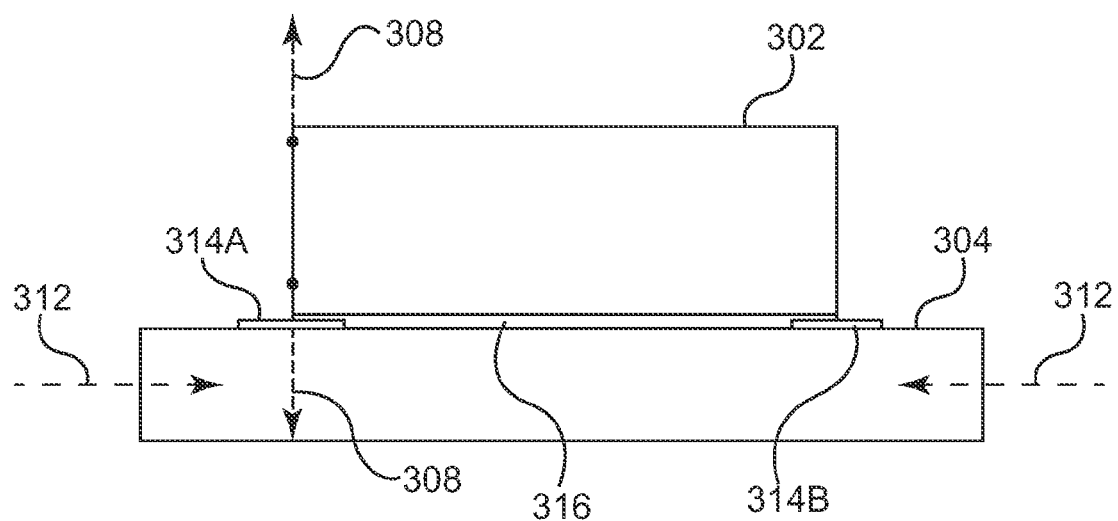
FIG. 3 is a diagram illustrating a side view of a semiconductor chip attached to a substrate and including a buffer layer according to one embodiment.

FIG. 3 is a diagram illustrating a side view of a semiconductor chip 302 attached to a substrate 304 and including a buffer layer 314 according to one embodiment. In one embodiment, the buffer layer 314 includes a plurality of buffer layer elements 314A-314B (collectively referred to as buffer layer 314 or buffer layer elements 314) formed on the substrate 304. In the illustrated embodiment, one buffer layer element 314 is provided at each of the four corners of the chip 302 (see FIG. 4A), although only two buffer layer elements 314 are visible in FIG. 3. The buffer layer 314 extends across less than an entire bottom surface of the semiconductor chip 302. In this embodiment, the corners of the chip 302 are bonded to the buffer layer elements 314, and the remaining portions of the bottom surface of the chip 302 are bonded directly to the substrate 304.

In one embodiment, buffer layer elements 314 are selectively applied at locations that have a high stress concentration in order to reduce stress and help avoid silicon cracking. The highest stress concentration is typically present near the corners of the chip 302. Thus, the buffering or mechanical decoupling provided by buffer layer elements 314 is effective by being positioned at these locations. The buffer layer elements 314 positioned between the chip 302 and the substrate 304 reduce the amount of tensile stress (indicated by arrows 308) caused by thermal contraction (indicated by arrows 312) of substrate 304. Thus, the buffer layer elements 314 help prevent the tensile stress from causing delamination of chip 302 from substrate 304, and help prevent any cracks on the sidewalls of the chip 302 from propagating through the chip 302.

In one embodiment, buffer layer elements 314 are deposited on substrate 304 as a continuous layer by a physical, chemical, or electrochemical process, and then structuring (e.g., lithography and selective etching) is applied to selectively remove buffer layer material (e.g., remove at least a center portion of the continuous layer), thereby leaving buffer layer elements 314. In one embodiment, chip 302 is then attached to substrate 304 and buffer layer elements 314 by diffusion soldering. In another embodiment, a different solder joint technique (e.g., soft soldering or eutectic bonding) is used for the attachment.

In another embodiment, the buffer layer elements 314 are formed directly without the need for structuring by using an electroplating or printing process. In yet another embodiment, the buffer layer elements 314 are formed at the wafer level on the backside of semiconductor die on a wafer. The wafer die are then singulated into individual semiconductor chips, and the semiconductor chips with the buffer layer elements 314 formed thereon are each attached to a substrate 304. In one embodiment, the buffer layer elements 314 are attached to substrate 304 by diffusion soldering or another metallic chip interconnect technique.

In one embodiment, semiconductor chip 302 is a silicon (Si) chip, and substrate 304 is a copper (Cu) or copper alloy die pad. Since the buffer layer elements 314 in the illustrated embodiment are positioned at the corners of the semiconductor chip 302 rather than across the entire bottom surface of the chip 302, most of the top surface of substrate 304 remains bare copper, which is an appropriate substrate in terms of reactivity to tin alloy solders. The tin (Sn) from the solder 316 and the copper of the substrate 304 form stable and reliable intermetallic phases. The copper of substrate 304 has a high diffusion and phase formation rate with the diffusion solder 316, resulting in a desired wetting and joining behaviour of the solder 316 and substrate 304.

The choice of a proper material for buffer layer elements 314 depends on the following criteria: (1) for diffusion soldering, the joining of solder 316 and buffer layer elements 314 should result in the formation of reliable intermetallic phases and interfaces; and (2) the modulus of elasticity (e-modulus) of the buffer layer elements 314 should be adapted to the joining partners (e.g., silicon of the chip 302 and copper of the substrate 304), in order to buffer thermomechanical stress in the system due to the coefficient of thermal expansion mismatch. In one embodiment, buffer layer elements 314 are a ductile metal. In one embodiment, buffer layer elements 314 are silver (Ag), indium (In), platinum (Pt), iron (Fe), gold (Au), palladium (Pd), or nickel (Ni) elements. In another embodiment, buffer layer elements 314 are multi-layer structures, such as a multi-layer stack of Ni/Pd/Au. In one embodiment, buffer layer elements 314 are 0.5 μm to 5 μm thick, which is thin enough to substantially maintain the surface flatness of substrate 304.

The buffer layer elements 314 are particularly advantageous for a diffusion soldered chip 302 and substrate 304, as the buffer layer elements 314 increases the crack resistance of the chip 302. The intrinsic stress in the device depends on the thickness ratio of the chip 302 to the substrate 304. The stress can be critical when the chip 302 and substrate 304 have about the same thickness. In one embodiment, chip 302 and substrate 304 each have a thickness of 0.2 mm to 0.4 mm.

Figure 4A:
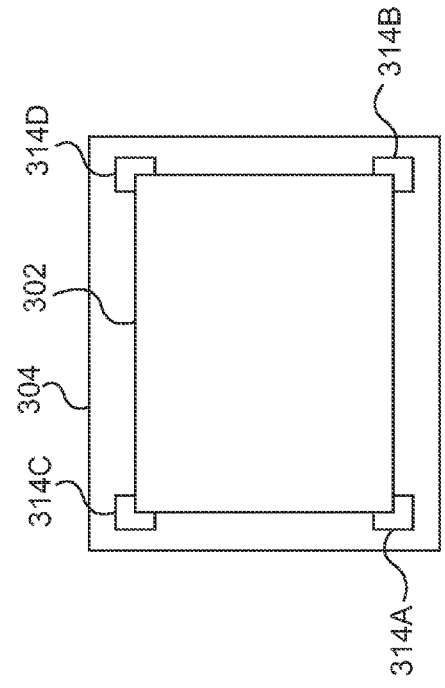
FIG. 4A is a diagram illustrating a top view of a substrate with a buffer layer formed thereon according to one embodiment.
Figure 4B:
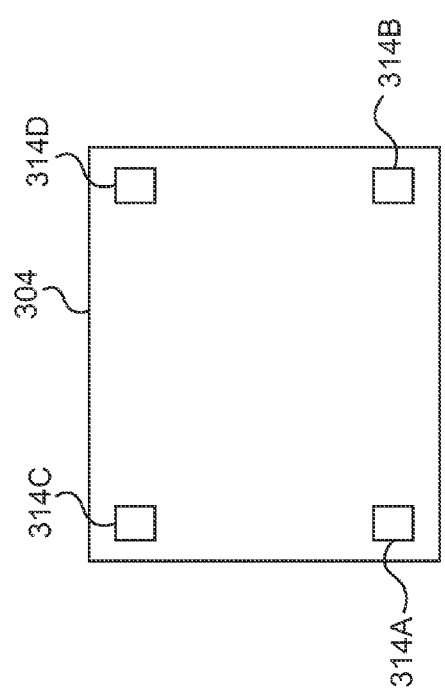
FIG. 4B is a diagram illustrating the substrate shown in FIG. 4A after attachment of a semiconductor chip to the substrate according to one embodiment.

FIG. 4A is a diagram illustrating a top view of the substrate 304 prior to attachment of the semiconductor chip 302 according to one embodiment. As shown in FIG. 4A, four separate and distinct buffer layer elements 314A-314D are formed on a top surface of the substrate 304. FIG. 4B is a diagram illustrating the substrate 304 shown in FIG. 4A after attachment of the semiconductor chip 302 to the substrate 304 according to one embodiment. Since the buffer layer elements 314 extend across only a portion of a bottom surface of the semiconductor chip 302 (i.e., the elements 314 only contact the corners of the semiconductor chip 302 in the illustrated embodiment), most of the bottom surface of chip 302 remains free to be directly soldered to the substrate 304.

Figure 5A:
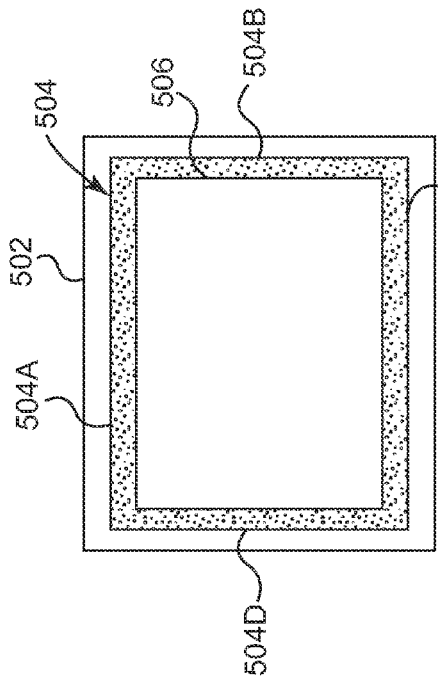
FIG. 5A is a diagram illustrating a top view of a substrate with a buffer layer formed thereon according to another embodiment.
Figure 5B:
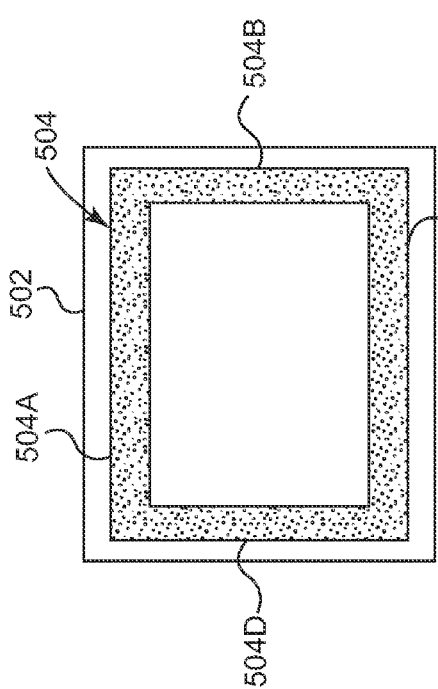
FIG. 5B is a diagram illustrating the substrate shown in FIG. 5A after attachment of a semiconductor chip to the substrate according to one embodiment.

FIG. 5A is a diagram illustrating a top view of a substrate 502 with a buffer layer 504 formed thereon according to another embodiment. Buffer layer 504 includes four buffer layer elements or strips 504A-504D that form a rectangle on the top surface of the substrate 502. FIG. 5B is a diagram illustrating the substrate 502 shown in FIG. 5A after attachment of a semiconductor chip 506 to the substrate according to one embodiment. Since the buffer layer elements 504 only contact the edges of the semiconductor chip 506 in the illustrated embodiment, most of the bottom surface of chip 506 remains free to be directly soldered to the substrate 304.

In one embodiment, buffer layer elements 504 perform the same functions, have the same properties, and are formed by the same processes as buffer layer elements 314, which were described above, with the exception that buffer layer elements 504 form a continuous boundary that extends along the four edges of a semiconductor chip, while buffer layer elements 314 are discrete elements that are positioned at the corners of a semiconductor chip. Buffer layer elements 504 provide more mechanical stress relief than buffer layer elements 314, at the expense of a reduction in the amount of area under the semiconductor chip that can be directly mounted to the substrate.

Figure 6:
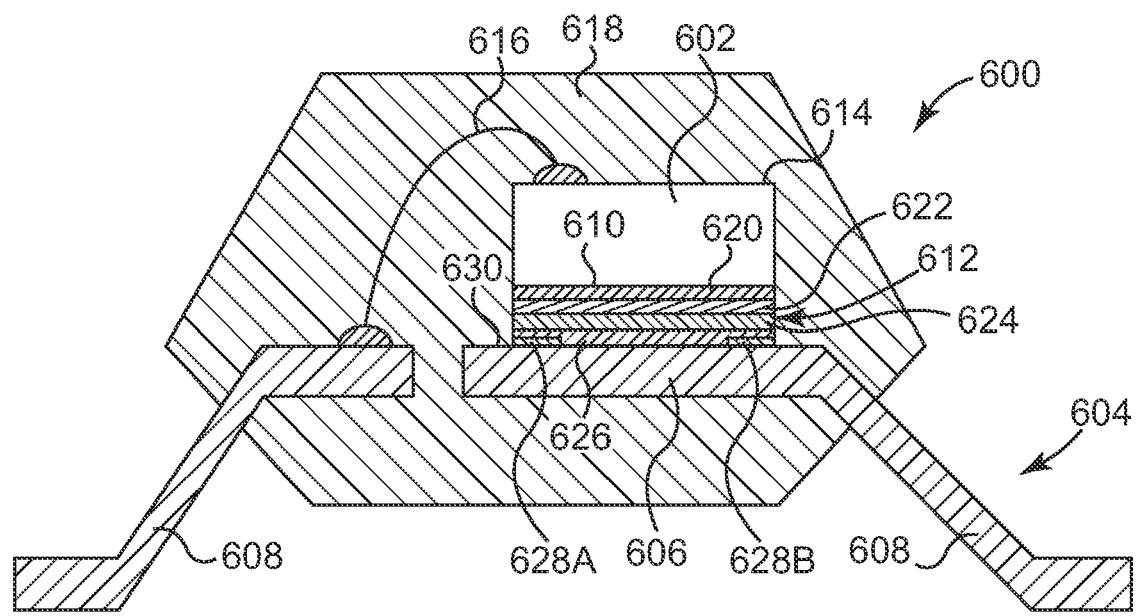
FIG. 6 is a diagram illustrating a cross-sectional view of a semiconductor package according to one embodiment.

FIG. 6 is a diagram illustrating a cross-sectional view of a semiconductor package 600 according to one embodiment. Semiconductor package 600 includes a semiconductor chip 602 and a leadframe 604. Leadframe 604 includes a die pad 606 and a plurality of leadfingers 608. In one embodiment, the semiconductor chip 602 comprises a vertical power device, such as an IGBT, a MOSFET, a Schottkey-Diode, or a PIN-Diode.

In the illustrated embodiment, the semiconductor chip 602 is a power MOSFET device that comprises silicon. The rear side 610 of the semiconductor chip 602 includes the drain electrode of the MOSFET and is mounted on, and electrically connected to, the die pad 606 of the leadframe 604 by a multi-layer connection structure 612. The upper side 614 of the semiconductor chip 602 is electrically connected to a plurality of the leadfingers 608 of the leadframe 604 by a plurality of bond wires 616. The semiconductor chip 602, die pad 606, bond wires 616, and inner portions of the leadfingers 608 are encapsulated in an epoxy resin 618, which provides the housing of the semiconductor package 600. The outer portions of the leadfingers 608 protrude from the plastic housing 618 and provide the external contacts of the package 600.

The connection structure 612 includes a contact layer 620, a barrier layer 622, and a diffusion solder layer 624. The contact layer 620 is disposed on the rear side 610 of the semiconductor chip 602. The contact layer 620 provides an ohmic contact on the rear surface 610 of the semiconductor chip 602. The barrier layer 622 is disposed on the contact layer 620. The barrier layer 622 provides a diffusion barrier between the contact layer 620 and the diffusion solder layer 624. In one embodiment, the diffusion barrier layer 622 is a metal layer, such as a titanium layer. The diffusion solder layer 624 is disposed on the barrier layer 622.

In one embodiment, the connection structure 612 is produced by vacuum deposition of the layers onto the rear surface of a silicon wafer. The rear surface is defined as the surface that is to be attached to the die pad. In one embodiment, the contact layer 620, the diffusion barrier layer 622, and the diffusion solder layer 624 are deposited by thermal evaporation, e-beam evaporation, dc sputtering, or rf sputtering.

A plurality of buffer layer elements 628A and 628B (collectively referred to as buffer layer elements 628 are disposed on an upper surface 630 of the die pad 606. The buffer layer elements 628 provide a mechanical decoupling of the semiconductor chip 602 from the die pad 606. In the illustrated embodiment, one buffer layer element 628 is provided at each of the four corners of the chip 602, although only two buffer layer elements 628 are visible in FIG. 6.

The semiconductor chip 602 is attached to the die pad 606 by placing the diffusion solder layer 624 on the upper surface 630 of the die pad 606 and heating the semiconductor chip 602 and the die pad 606 such that the intermetallic phases 626 are formed at the interface between the upper surface 630 of the die pad 606 and the diffusion solder layer 624, and at the interface between the buffer layer elements 628 and the diffusion solder layer 624. The semiconductor chip 602 is mechanically attached and electrically connected to the die pad 606 of the leadframe 604 by the intermetallic phases 626.

In one embodiment, the diffusion solder layer 624 comprises a diffusion solder material that forms intermetallic phases with the material of the die pad 606 at a temperature of approximately 200° C. to approximately 400° C. In one embodiment, the diffusion solder layer 624 comprises AuSn, AgSn, InSn, or CuSn, and the die pad 606 comprises copper or a copper alloy.

The buffer layer elements 628 positioned between the chip 602 and the die pad 606 reduce the amount of stress caused by thermal contraction of the die pad 606. Thus, the buffer layer elements 628 help prevent the stress from causing delamination of chip 602 from die pad 606, and help prevent any cracks on the sidewalls of the chip 602 from propagating through the chip 602.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component comprising:
   a metal substrate;
   a semiconductor chip configured to be attached to the metal substrate;
   a buffer layer positioned between the metal substrate and the semiconductor chip configured to mechanically decouple the semiconductor chip and the metal substrate and reduce stress on the semiconductor chip caused by thermal contraction of the metal substrate, wherein the buffer layer extends across less than an entire bottom surface of the semiconductor chip, wherein the buffer layer comprises a plurality of separate and distinct buffer layer elements, wherein at least one of the buffer layer elements is positioned adjacent to a corner of the semiconductor chip and extends laterally substantially beyond the bottom surface of the semiconductor chip, and wherein the buffer layer comprises Ag, In, Pt, Fe, Au, Pd, or Ni; and
   intermetallic phases attaching the semiconductor chip to the buffer layer and to the metal substrate.

2. The electronic component of claim 1, wherein the buffer layer comprises four separate and distinct buffer layer elements.

3. The electronic component of claim 2, wherein each of the buffer layer elements is positioned adjacent to a corner of the semiconductor chip and extends substantially beyond the bottom surface of the semiconductor chip.

4. The electronic component of claim 1, wherein the substrate comprises Cu or a copper alloy, and the semiconductor chip comprises Si.

5. The electronic component of claim 1, wherein the buffer layer is about 0.5 to 5 μm thick.

6. The electronic component of claim 1, wherein the buffer layer comprises a multi-layer stack.

7. The electronic component of claim 6, wherein the multi-layer stack includes a Ni layer, a Pd layer, and an Au layer.

8. The electronic component of claim 1, and further comprising a diffusion solder layer positioned over the buffer layer and the metal substrate, the diffusion solder layer configured to form the intermetallic phases.

9. The electronic component of claim 1, wherein the buffer layer is deposited as a continuous layer on the metal substrate, and etched to remove at least a center portion of the continuous layer.

10. The electronic component of claim 1, wherein the buffer layer is formed by an electroplating or printing process.

11. The electronic component of claim 1, wherein the buffer layer is formed on a backside of the semiconductor chip with a wafer level process.

12. The electronic component of claim 1, wherein the metal substrate is a die pad of a leadframe.

13. The electronic component of claim 1, wherein the semiconductor chip comprises a vertical power device.

14. The electronic component of claim 1, wherein the buffer layer elements include four strips positioned in a rectangular shape.

15. The electronic component of claim 14, wherein each of the strips is positioned adjacent to an edge of the semiconductor chip and extends laterally substantially beyond the bottom surface of the semiconductor chip.

16. An electronic component comprising:
a metal substrate;
a semiconductor chip configured to be attached to the metal substrate;
a buffer layer positioned between the metal substrate and the semiconductor chip configured to mechanically decouple the semiconductor chip and the metal substrate and reduce stress on the semiconductor chip caused by thermal contraction of the metal substrate, wherein the buffer layer extends across less than an entire bottom surface of the semiconductor chip, wherein the buffer layer comprises a plurality of separate and distinct buffer layer elements, wherein at least one of the buffer layer elements is positioned adjacent to a corner of the semiconductor chip and extends substantially beyond the bottom surface of the semiconductor chip, wherein the buffer layer comprises a multi-layer stack, and wherein the multi-layer stack includes a Ni layer, a Pd layer, and an Au layer; and
intermetallic phases attaching the semiconductor chip to the buffer layer and to the metal substrate.

17. An electronic component comprising:
a metal substrate;
a semiconductor chip configured to be attached to the metal substrate;
a buffer layer positioned between the metal substrate and the semiconductor chip configured to mechanically decouple the semiconductor chip and the metal substrate and reduce stress on the semiconductor chip caused by thermal contraction of the metal substrate, wherein the buffer layer extends across less than an entire bottom surface of the semiconductor chip, wherein the buffer layer comprises a plurality of separate and distinct buffer layer elements, wherein at least one of the buffer layer elements is positioned adjacent to a corner of the semiconductor chip and extends laterally substantially beyond the bottom surface of the semiconductor chip, and wherein the buffer layer is about 0.5 to 5 μm thick; and
intermetallic phases attaching the semiconductor chip to the buffer layer and to the metal substrate.

18. A semiconductor device comprising:
a metal substrate;
a semiconductor chip configured to be attached to the metal substrate; and
buffering means positioned between the metal substrate and the semiconductor chip for mechanically decoupling the semiconductor chip and the metal substrate and reducing stress on the semiconductor chip caused by thermal contraction of the metal substrate, wherein the buffering means extends across less than an entire bottom surface of the semiconductor chip, wherein the buffering means comprises a plurality of separate and distinct buffer layer elements, and wherein at least one of the buffer layer elements is positioned adjacent to a corner of the semiconductor chip and extends substantially beyond the bottom surface of the semiconductor chip; and
intermetallic phases attaching the semiconductor chip to the buffering means and to the metal substrate.

* * * * *